US008544157B2

(12) United States Patent
Sugahara et al.

(10) Patent No.: US 8,544,157 B2
(45) Date of Patent: Oct. 1, 2013

(54) METHOD FOR PRODUCING A LIQUID TRANSPORT APPARATUS

(75) Inventors: Hiroto Sugahara, Aichi-ken (JP); Yasuhiro Sekiguchi, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 805 days.

(21) Appl. No.: 12/027,956

(22) Filed: Feb. 7, 2008

(65) Prior Publication Data

US 2008/0186364 A1 Aug. 7, 2008

(30) Foreign Application Priority Data

Feb. 7, 2007 (JP) ................................ 2007-027661

(51) Int. Cl.
*B21D 53/76* (2006.01)
*H05K 3/10* (2006.01)

(52) U.S. Cl.
USPC ............ 29/25.35; 29/890.1; 29/846; 347/70; 427/100; 310/324

(58) Field of Classification Search
USPC ............... 29/890.1, 25.35, 846, 830; 347/68, 347/70, 71; 427/100; 310/324, 348
See application file for complete search history.

(56) References Cited

U.S. PATENT DOCUMENTS 6,336,716 B1 * 1/2002 Sakamaki et al. .............. 347/68
2005/0068376 A1 3/2005 Sugahara
2005/0270339 A1 * 12/2005 Sugahara ........................ 347/68
2006/0044359 A1 3/2006 Sugahara
2006/0181582 A1 * 8/2006 Sugahara ........................ 347/70

FOREIGN PATENT DOCUMENTS

JP 58108163 A * 6/1983 ................. 347/71 X
JP H05-050597 A 3/1993
JP 10034922 A * 2/1998
JP 2004079695 A 3/2004
JP 2005125743 A 5/2005
JP 2006-096034 A 4/2006
JP 2006096034 A 4/2006
JP 2006-231530 A 9/2006

OTHER PUBLICATIONS

Machine Language Translation of JP 10-34922.*
Machine Language Translation of JP 10-34922, dated Nov. 5, 2010.*
Japan Patent Office, Notice of Reasons for Rejection for Japanese Patent Application No. 2007-027661 (counterpart to above-captioned patent application), mailed Aug. 23, 2011.

* cited by examiner

*Primary Examiner* — A. Dexter Tugbang
(74) *Attorney, Agent, or Firm* — Baker Botts L.L.P.

(57) ABSTRACT

A method for producing a liquid transport apparatus includes forming a recess, on a surface of a vibration plate on a side not facing the pressure chamber, in one of areas which are defined by dividing an area overlapping with a pressure chamber in a predetermined direction; forming a piezoelectric layer by depositing particles of a piezoelectric material on the surface of the vibration plate on which the recess is formed so that a thickness of a portion of the piezoelectric layer corresponding to the area formed with the recess is thinner than a thickness of a portion corresponding to an area not formed with the recess; and forming a first electrode, on a surface of the piezoelectric layer on a side not facing the vibration plate, in an area overlapping with the pressure chamber and corresponding to the area of the vibration plate not formed with the recess.

11 Claims, 12 Drawing Sheets

METHOD FOR PRODUCING A LIQUID TRANSPORT APPARATUS

CROSS REFERENCE TO RELATED APPLICATION

The present application claims priority from Japanese Patent Application No. 2007-027661, filed on Feb. 7, 2007, the disclosure of which is incorporated herein by reference in its entirety.

BACKGROUND OF THE INVENTION

1. Field of the Invention

The present invention relates to a method for producing a liquid transport apparatus, the liquid transport apparatus, a method for producing a liquid droplet-jetting apparatus, and the liquid droplet-jetting apparatus.

2. Description of the Related Art

An ink-jet head, in which an ink is transported to nozzles and the ink is discharged from the nozzles to a recording medium, is known as a liquid transport apparatus for transporting a liquid to a predetermined position by applying the pressure to the liquid. Such an ink-jet head is exemplified by an ink-jet head wherein a vibration plate, which is arranged to cover a pressure chamber therewith, is deformed by means of a piezoelectric actuator to apply the pressure to the ink in the pressure chamber, and thus the ink is discharged from the nozzle communicated with the pressure chamber. For example, in the case of an ink-jet head described in Unites States Patent Application Publication No. 2005/0068376A1 (corresponding to Japanese Patent Application Laid-open No. 2005-125743), a piezoelectric layer is formed on an upper surface of a vibration plate, and an upper electrode (individual electrode) is formed at a portion of an upper surface of the piezoelectric layer overlapped with a pressure chamber. The so-called push type jetting operation is performed such that an electric potential, which is higher than that applied to the vibration plate as a lower electrode, is applied to the upper electrode, and thus the vibration plate is deformed so that the vibration plate projects toward the pressure chamber to apply the pressure to the ink in the pressure chamber, and the ink is discharged from the nozzle.

In the case of the ink-jet head described in Unites States Patent Application Publication No. 2005/0068376A1, the so-called pull type jetting operation can be also performed, in addition to the push type jetting operation as described above, such that the upper electrode is previously allowed to have an electric potential higher than the electric potential of the vibration plate to deform the vibration plate so that the vibration plate projects toward the pressure chamber beforehand, and the deformation of the vibration plate is once returned to have the original shape every time when the ink discharge request is made, after which the vibration plate is deformed again at a predetermined timing to discharge the ink from the nozzle. In the case of the pull type jetting operation as described above, the vibration plate is deformed again to project toward the pressure chamber at such a timing that the negative pressure wave, which is generated in the pressure chamber when the deformation of the vibration plate is returned to have the original shape, is reversed to the positive, and the pressure wave is overlapped therewith. Accordingly, the pressure, which is applied to the ink in the pressure chamber, can be made greater than that obtained when the push type jetting operation is performed. Therefore, the low voltage driving can be performed when the pull type jetting operation is performed as compared with when the push type jetting operation is performed.

However, in order to perform the pull type jetting operation with the ink-jet head described in Unites States Patent Application Publication No. 2005/0068376A1, it is necessary that the upper electrode should always have the electric potential higher than that of the vibration plate when the ink discharge is not performed, and the electric field should be continuously applied to the piezoelectric layer. For this reason, the following problem arises. That is, it is feared that the durability of the piezoelectric layer may be lowered, and the electric power consumption may be increased.

In the case of the ink-jet head described above, the piezoelectric layer, which is interposed between the upper electrode and the vibration plate, serves as the driving area. The vibration plate is deformed in accordance with the shrinkage of the driving area, and the pressure is applied to the ink in the pressure chamber. Areas other than the driving area are present on the piezoelectric layer, because the piezoelectric layer is formed on the entire surface of the vibration plate without providing any space. The deformation of the vibration plate is inhibited by the portions of the piezoelectric layer corresponding to the areas other than the driving area. Therefore, the following problem also arises. That is, the driving voltage is increased, and the electric power consumption is increased in order to obtain the desired deformation amount for the vibration plate during the ink discharge.

SUMMARY OF THE INVENTION

An object of the present invention is to provide a liquid transport apparatus and a liquid droplet-jetting apparatus in which the electric power consumption is small, and methods for producing such a liquid transport apparatus and such a liquid droplet-jetting apparatus.

According to a first aspect of the present invention, there is provided a method for producing a liquid transport apparatus including: a flow passage unit which includes a pressure chamber having a liquid inflow port and a liquid outflow port; and a piezoelectric actuator which includes a vibration plate joined to one surface of the flow passage unit to cover the pressure chamber therewith and a piezoelectric layer formed of a piezoelectric material and which selectively changes a volume of the pressure chamber, the method including: forming a recess, on a surface of the vibration plate on a side not facing the pressure chamber, in one of areas defined by dividing an area overlapping with the pressure chamber in a predetermined direction; forming the piezoelectric layer by depositing particles of the piezoelectric material on the surface of the vibration plate on which the recess is formed so that a thickness of a portion of the piezoelectric layer corresponding to the recess is thinner than a thickness of another portion corresponding to an area not formed with the recess; and forming a first electrode, on a surface of the piezoelectric layer on a side not facing the vibration plate, in an area which is overlapping with the pressure chamber and which corresponds to the area, of the vibration plate, not formed with the recess.

In the liquid transport apparatus produced in accordance with the first aspect of the present invention, the volume of the pressure chamber is changed to apply the pressure to the liquid in the pressure chamber by partially deforming the areas of the piezoelectric layer and the vibration plate overlapping with the pressure chamber, and thus the liquid is jetted from the nozzle. In this aspect, when the liquid transport apparatus is produced, the recess is formed, on the surface of the vibration plate disposed on the side not facing the pressure chamber, in one of areas defined by dividing the area overlapping with the pressure chamber in the predetermined direction, and then the particles of the piezoelectric material are deposited. Accordingly, the piezoelectric layer is formed, in which the portion corresponding to the area formed with the recess is thinner than the portion corresponding to the area not formed with the recess. After that, the first electrode is formed, on the surface of the piezoelectric layer on the side not facing the vibration plate, in the area which is overlapping with the pressure chamber and which corresponds to the area of the vibration plate not formed with the recess.

Therefore, the thickness of the vibration plate, which is provided in the area formed with the recess, can be made thinner than the thickness of the vibration plate which is provided in those other than the area described above. Therefore, it is possible to decrease the rigidity of the vibration plate. Further, the recess is formed, on the surface of the vibration plate on the side not facing the pressure chamber, in one of areas defined by dividing the area overlapping with the pressure chamber in the predetermined direction. Therefore, the area, in which the rigidity is small, can be provided as the large area. It is possible to further decrease the rigidity of the vibration plate.

The thickness of the vibration plate is thinned, and the thickness of the piezoelectric layer is also thinned in the area of the vibration plate in which the recess is formed. Therefore, it is possible to decrease the rigidity of the area in which the recess is formed, as compared with a case in which a piezoelectric layer, which has a uniform thickness, is formed on the entire surface of the vibration plate. Therefore, it is possible to produce the liquid transport apparatus which can suppress the electric power consumption.

The method for producing the liquid transport apparatus of the present invention may further include forming a second electrode, on the surface of the vibration plate formed with the recess, in an area which is overlapping with the pressure chamber and which is not formed with the recess, after forming the recess and before forming the piezoelectric layer. In this way, after the recess is formed, the second electrode is formed in the area which is disposed on the surface of the vibration plate formed with the recess, which is overlapping with the pressure chamber, and which is not formed with the recess. After that, the particles of the piezoelectric material are deposited. Accordingly, the piezoelectric layer is formed, in which the thickness of the portion corresponding to the recess is thinner than the thickness of the portion corresponding to the area not formed with the recess. The first electrode is formed in the area of the piezoelectric layer corresponding to the second electrode. Therefore, the first electrode can be arranged corresponding to the second electrode. Therefore, the area of the piezoelectric layer, which corresponds to the both electrodes, can be driven reliably. It is possible to suppress the electric power consumption.

In the method for producing the liquid transport apparatus of the present invention, the recess may be formed, on the surface of the vibration plate on the side not facing the pressure chamber, in one of areas defined by dividing the area overlapping with the pressure chamber in the predetermined direction to pass through a center of gravity of the pressure chamber.

In the method for producing the liquid transport apparatus of the present invention, the recess may be formed as a plurality of recesses in the area overlapping with the pressure chamber. When the plurality of recesses are formed, it is possible to further decrease the rigidity of the area of the vibration plate overlapping with the pressure chamber as compared with the case in which the recess is singular.

In the method for producing the liquid transport apparatus of the present invention, the pressure chamber may have an elongate shape, and the recess may be formed, on the surface of the vibration plate on the side not facing the pressure chamber, in the one of areas defined by dividing the area overlapping with the pressure chamber in a transverse direction of the pressure chamber. The pressure chamber has the elongate shape, and hence the high density arrangement can be provided as compared with the case in which the pressure chamber has a short shape. Further, the recess is formed in one of areas defined by dividing the area overlapping with the pressure chamber in the transverse direction of the pressure chamber. Therefore, the recess and the electrode are aligned in the transverse direction of the pressure chamber. Accordingly, it is possible to improve the deformation efficiency of the piezoelectric layer, and it is possible to increase the amount of displacement of the vibration plate.

In the method for producing the liquid transport apparatus of the present invention, the recess may be formed to extend in a longitudinal direction of the pressure chamber. In this case, the recess extends in the longitudinal direction of the pressure chamber in the area overlapping with the pressure chamber. Therefore, it is possible to reliably decrease the rigidity of the vibration plate.

In the method for producing the liquid transport apparatus of the present invention, the recess may be formed to extend to an area outside of the pressure chamber. In this case, it is possible to increase the area in which the vibration plate is deformed. Therefore, it is possible to further decrease the rigidity of the vibration plate.

In the method for producing the liquid transport apparatus of the present invention, the piezoelectric layer may be formed by a chemical vapor deposition method or an aerosol deposition method. When the piezoelectric layer is formed by using the chemical vapor deposition method or the aerosol deposition method, the piezoelectric layer portion, which is on the surface of the recess, can be made thin as compared with the piezoelectric layer portion in the other areas, without applying, for example, the mask treatment. Therefore, it is possible to simplify the production steps.

In the method for producing the liquid transport apparatus of the present invention, the vibration plate may be formed of a metal material, and the method may further include forming an insulating film on the surface of the vibration plate on which the recess is formed, after forming the recess and before forming the second electrode. In this case, the vibration plate is formed of the metal material. Therefore, the recess can be easily formed, for example, by means of the etching, and it is possible to lower the production cost. The vibration plate composed of the metal material is excellent in the strength and the toughness. Therefore, it is possible to improve the durability as well.

In the method for producing the liquid transport apparatus of the present invention, the insulating film may be formed by a chemical vapor deposition method or an aerosol deposition method. When the insulating film is formed by using the chemical vapor deposition method or the aerosol deposition method, it is possible to further simplify the production steps, because the production process is the same as or equivalent to that adopted when the piezoelectric layer is formed.

According to a second aspect of the present invention, there is provided a liquid transport apparatus which transports a liquid, including: a flow passage unit which includes a pressure chamber having a liquid inflow port and a liquid outflow port; a vibration plate which is joined to one surface of the flow passage unit to cover the pressure chamber therewith and which has a recess formed, on a surface disposed on a side not facing the pressure chamber, in one of areas defined by dividing an area overlapping with the pressure chamber in a predetermined direction; a piezoelectric layer which is arranged to face the surface of the vibration plate formed with the recess and which has a portion corresponding to the recess of the vibration plate, a thickness of the portion being thinner than a thickness of the other portion corresponding to an area of the vibration plate not formed with the recess; and a first electrode which is arranged, on a surface of the piezoelectric layer on a side not facing the vibration plate, in an area overlapping with the pressure chamber and corresponding to the area of the vibration plate not formed with the recess.

According to the second aspect of the present invention, when the electric potential difference is generated between the first electrode and the second electrode to generate the electric field at the portion of the piezoelectric layer interposed by these electrodes, the piezoelectric layer is deformed. When the piezoelectric layer is deformed, then the portion of the vibration plate, at which the first and second electrodes are arranged, is deformed so that the portion is warped upwardly, and the volume of the pressure chamber is increased.

Therefore, the electric potential difference is generated between the first electrode and the second electrode to increase the volume of the pressure chamber, and then the electric potential difference between the first electrode and the second electrode is allowed to disappear so that the volume of the pressure chamber is returned to the original volume. Accordingly, the pressure can be applied to the liquid in the pressure chamber, and the liquid droplets can be jetted from the nozzle. In other words, the pull type jetting operation can be performed, in which the liquid droplets are jetted from the nozzle such that the volume of the pressure chamber is once increased and then the volume of the pressure chamber is retuned to the original volume. In this case, it is unnecessary that the electric potential difference is previously generated between the first electrode and the second electrode when the liquid droplets are not jetted. It is possible to reduce the electric power consumption.

The liquid transport apparatus of the present invention may further include a second electrode which is arranged, between the piezoelectric layer and the vibration plate, in an area corresponding to the area of the vibration plate not formed with the recess.

In the liquid transport apparatus of the present invention, the recess may be formed, on the surface of the vibration plate on the side not facing the pressure chamber, in one of areas defined by dividing the area overlapping with the pressure chamber in the predetermined direction to pass through a center of gravity of the pressure chamber.

According to a third aspect of the present invention, there is provided a method for producing a liquid droplet-jetting apparatus including: a flow passage unit which has a pressure chamber communicated with a nozzle; and a piezoelectric actuator which has a vibration plate joined to one surface of the flow passage unit to cover the pressure chamber therewith and a piezoelectric layer formed of a piezoelectric material and which selectively changes a volume of the pressure chamber, the method including: forming a recess, on a surface of the vibration plate on a side not facing the pressure chamber, in one of areas which are defined by dividing an area overlapping with the pressure chamber in a predetermined direction; forming the piezoelectric layer by depositing particles of the piezoelectric material on the surface of the vibration plate on which the recess is formed so that a thickness of a portion of the piezoelectric layer corresponding to the recess is thinner than a thickness of another portion corresponding to an area not formed with the recess; and forming a first electrode, on a surface of the piezoelectric layer on a side not facing the vibration plate, in an area which overlaps with the pressure chamber and which corresponds to the area, of the vibration plate, not formed with the recess.

According to the third aspect of the present invention, it is possible to produce the liquid droplet-jetting apparatus which can suppress the electric power consumption.

The method for producing the liquid droplet-jetting apparatus of the present invention may further include forming a second electrode, on the surface of the vibration plate formed with the recess, in an area which overlaps with the pressure chamber and which is not formed with the recess, after forming the recess and before forming the piezoelectric layer.

In the method for producing the liquid droplet-jetting apparatus of the present invention, the recess may be formed, on the surface of the vibration plate on the side not facing the pressure chamber, in one of areas defined by dividing the area overlapping with the pressure chamber in the predetermined direction to pass through a center of gravity of the pressure chamber.

According to a fourth aspect of the present invention, there is provided a liquid droplet-jetting apparatus which jets liquid droplets, including: a flow passage unit which includes a pressure chamber communicated with a nozzle; a vibration plate which is joined to one surface of the flow passage unit to cover the pressure chamber therewith and which has a recess formed, on a surface on a side not facing the pressure chamber, in one of areas provided by dividing an area overlapping with the pressure chamber in a predetermined direction; a piezoelectric layer which is arranged to face the surface of the vibration plate formed with the recess and which has a portion corresponding to the area of the vibration plate formed with the recess, a thickness of the portion being thinner than a thickness of the other portion corresponding to the other area of the vibration plate not formed with the recess; and a first electrode which is arranged, on a surface of the piezoelectric layer disposed on a side not facing the vibration plate, in an area corresponding to the area of the vibration plate overlapping with the pressure chamber and not formed with the recess.

According to the fourth aspect of the present invention, it is possible to reduce the electric power consumption.

The liquid droplet-jetting apparatus of the present invention may further include a second electrode which is arranged, between the piezoelectric layer and the vibration plate, in an area corresponding to the area of the vibration plate not formed with the recess.

In the liquid droplet-jetting apparatus of the present invention, the recess may be formed, on the surface of the vibration plate on the side not facing the pressure chamber, in one of areas defined by dividing the area overlapping with the pressure chamber in the predetermined direction to pass through a center of gravity of the pressure chamber.

BRIEF DESCRIPTION OF THE DRAWINGS

FIG. 7 shows steps for producing the ink-jet head, wherein

DESCRIPTION OF THE PREFERRED EMBODIMENTS

An embodiment of the present invention will be explained. This embodiment is an example in which the present invention is applied to an ink-jet head for jetting an ink onto the recording paper, provided as the liquid transport apparatus.

Figure 1:
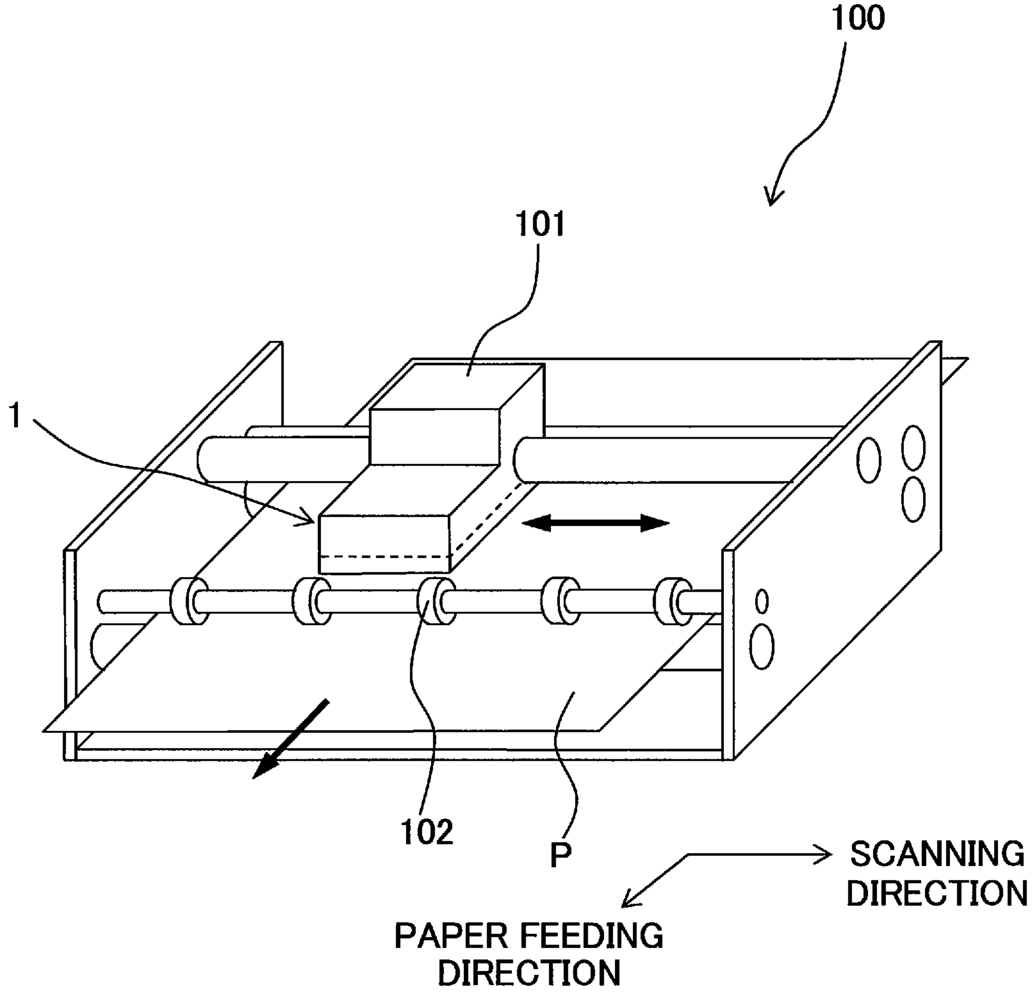
FIG. 1 shows a schematic perspective view illustrating an ink-jet printer according to an embodiment of the present invention.

At first, an ink-jet printer 100 provided with the ink-jet head 1 will be briefly explained. As shown in FIG. 1, the ink-jet printer 100 is provided with, for example, a carriage 101 which is movable in the left-right direction as shown in FIG. 1, the serial type ink-jet head 1 which is provided for the carriage 101 to jet the ink onto the recording paper P, and transport rollers 102 which transport the recording paper P in the frontward direction as shown in FIG. 1. The ink-jet head 1 is moved in the left-right direction (scanning direction) integrally with the carriage 101 to jet the ink onto the recording paper P from jetting ports of nozzles 20 (see FIGS. 2 to 5) formed on the ink discharge surface of the lower surface of the ink-jet head 1. The recording paper P, on which the recording is performed by the ink-jet head 1, is discharged in the frontward direction (paper feeding direction) by the transport rollers 102.

Next, the ink-jet head 1 will be explained in detail with reference to FIGS. 2 to 5.

Figure 2:
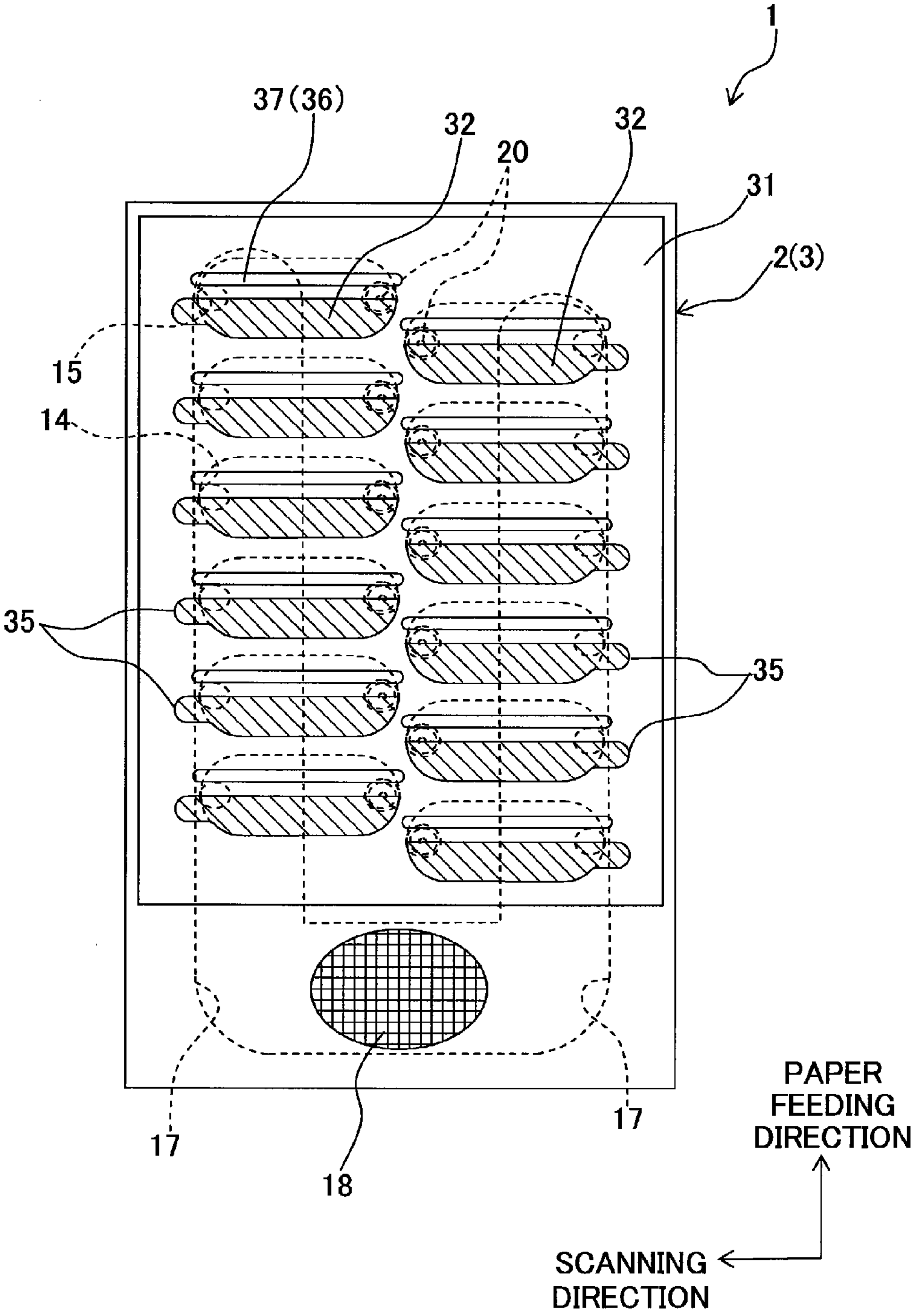
FIG. 2 shows a plan view illustrating an ink-jet head.
Figure 3:
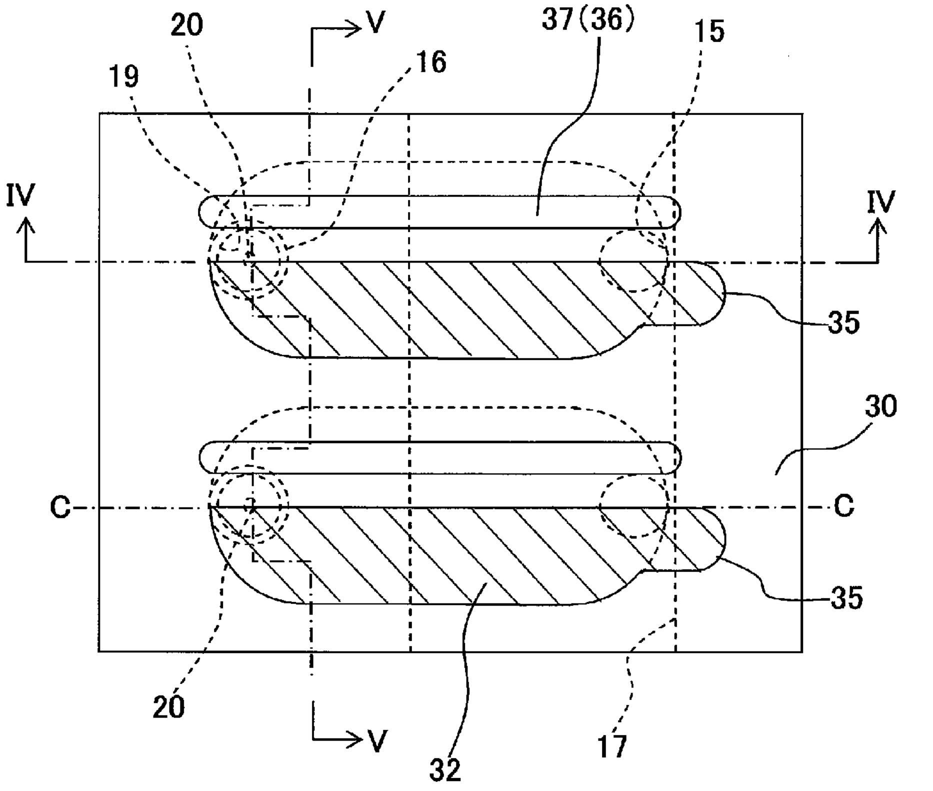
FIG. 3 shows a partial magnified plan view illustrating the ink-jet head shown in FIG. 2.
Figure 4:
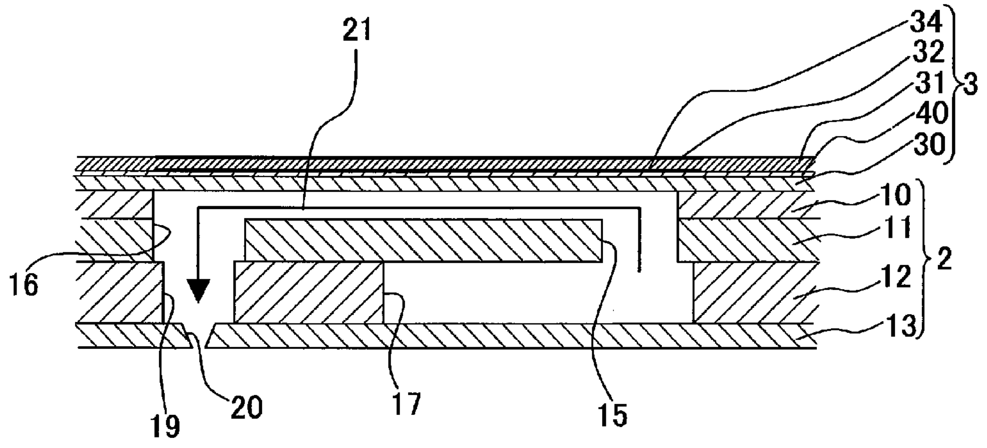
FIG. 4 shows a sectional view taken along a line IV-IV shown in FIG. 3.

As shown in FIGS. 2 to 4, the ink-jet head 1 is provided with a flow passage unit 2 which has individual ink flow passages 21 (see FIG. 4) including pressure chambers 14 therein, and a piezoelectric actuator 3 which is stacked on the upper surface of the flow passage unit 2.

At first, the flow passage unit 2 will be explained. As shown in FIG. 4, the flow passage unit 2 includes a cavity plate 10, a base plate 11, a manifold plate 12, and a nozzle plate 13. The four plates 10 to 13 are adhered to one another in a stacked state. In particular, the cavity plate 10, the base plate 11, and the manifold plate 12 are the plates made of stainless steel. Ink flow passages, which include, for example, a manifold 17 and the pressure chambers 14 as described later on, can be easily formed for the three plates 10 to 12 by means of the etching. The nozzle plate 13 is formed of, for example, a high molecular weight synthetic resin material such as polyimide, which is adhered to the lower surface of the manifold plate 12. Alternatively, the nozzle plate 13 may be also formed of a metal material such as stainless steel in the same manner as the three plates 10 to 12.

As shown in FIGS. 2 to 4, a plurality of pressure chambers 14 are formed along the surface of the cavity plate 10. The plurality of pressure chambers 14 are open on the surface of the flow passage unit 2 (upper surface of the cavity plate 10 to which a vibration plate 30 is joined or bonded as described later on). The plurality of pressure chambers 14 are arranged in two arrays in the paper feeding direction (upward-downward direction as shown in FIG. 2). Each of the pressure chambers 14 is formed to have a substantially elliptical shape as viewed in a plan view. The pressure chambers 14 are arranged so that the major axis direction thereof is the left-right direction (scanning direction). Further, each of the pressure chambers 14 has a symmetrical shape in relation to a straight line C which passes through the center of gravity of each of the pressure chambers 14 and which is parallel to the scanning direction. An ink supply port 18, which is connected to an unillustrated ink tank, is formed for the cavity plate 10.

As shown in FIGS. 3 and 4, communication holes 15, 16 are formed at positions of the base plate 11 overlapped with the both ends of the pressure chamber 14 in the major axis direction as viewed in a plan view respectively. The manifold 17, which extends in the paper feeding direction (upward-downward direction as shown in FIG. 2) and which is overlapped with any one of the left and right ends of the pressure chamber 14 shown in FIG. 2 as viewed in a plan view, is formed for the manifold plate 12. The ink is supplied to the manifold 17 from the ink tank via the ink supply port 18. A communication hole 19 is also formed at a position overlapped with the end of the pressure chamber 14 disposed on the side opposite to the manifold 17 as viewed in a plan view. Further, a plurality of nozzles 20 are formed for the nozzle plate 13 at positions overlapped with the plurality of communication holes 19 respectively as viewed in a plan view. The nozzles 20 are formed, for example, by applying the excimer laser processing to a substrate of high molecular weight synthetic resin such as polyimide.

As shown in FIG. 4, the manifold 17 is communicated with the pressure chamber 14 via the communication hole 15, and the pressure chamber 14 is communicated with the nozzle 20 via the communication holes 16, 19. In this way, the individual ink flow passage 21, which ranges from the manifold 17 via the pressure chamber 14 to the nozzle 20, is formed in the flow passage unit 2.

Next, the piezoelectric actuator 3 will be explained. As shown in FIGS. 2 to 5, the piezoelectric actuator 3 includes the vibration plate 30 which is conductive and which is arranged on the upper surface of the flow passage unit 2, an insulating film 40 which is stacked on the surface of the vibration plate 30 formed with recesses 36, a piezoelectric layer 31 which is formed continuously to range over the plurality of pressure chambers 14 on the upper surface of the insulating film 40, a plurality of common electrodes 34 which are formed between the piezoelectric layer 31 and the insulating film 40 to correspond to the plurality of pressure chambers 14, and a plurality of individual electrodes 32 which are formed on the upper surface of the piezoelectric layer 31 while corresponding to the common electrodes 34.

The vibration plate 30 is the plate which is formed of a metal material and which has a substantially rectangular shape as viewed in a plan view. The vibration plate 30 is formed of, for example, iron-based alloy such as stainless steel, copper-based alloy, nickel-based alloy, or titanium-based alloy. The vibration plate 30 may have a thickness of about 20 μm, which is stacked and joined onto the upper surface of the cavity plate 10 in a such a state that the openings of the plurality of pressure chambers 14 are closed therewith.

Figure 18:
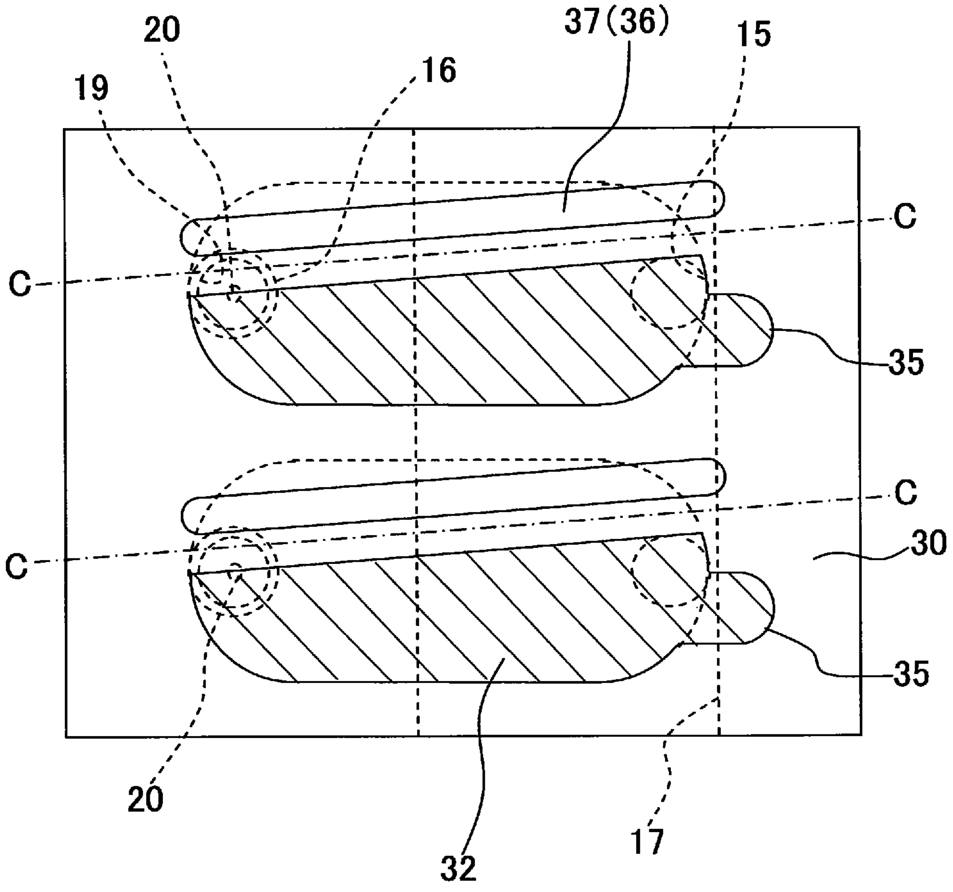
FIG. 18 shows a magnified plan view illustrating another modified embodiment corresponding to FIG. 3.

As shown in FIG. 3, it is now assumed for the area overlapped with each of the pressure chambers 14 on the upper surface of the vibration plate 30 (surface disposed on the side not facing the flow passage unit 2) that the area is divided into two, for example, by the dividing or parting line C which passes through the center (center of gravity) in the transverse direction of each of the pressure chambers 14. On this assumption, the recess 36, which extends in the longitudinal direction of the pressure chamber 14, is formed in one area (on the upper side in the plane of paper) of the divided areas. The width of the recess 36 may be about 40 to 50 μm. The recess 36 is formed to extend to an area outside the area overlapped with the pressure chamber 14 as viewed in a plan view, on the upper surface of the vibration plate 30. The following description will be made as based on the use of an example in which the area, which is overlapped with each of the pressure chambers 14, is divided by the dividing line C which passes through the center in the transverse direction of each of the pressure chambers 14. However, for example as shown in FIG. 18, it is not necessarily indispensable that the dividing line C passes through the center in the transverse direction of the pressure chamber 14. The effect of the present invention can be obtained provided that the line divides the area overlapped with each of the pressure chambers 14 in a predetermined direction.

Figure 5:
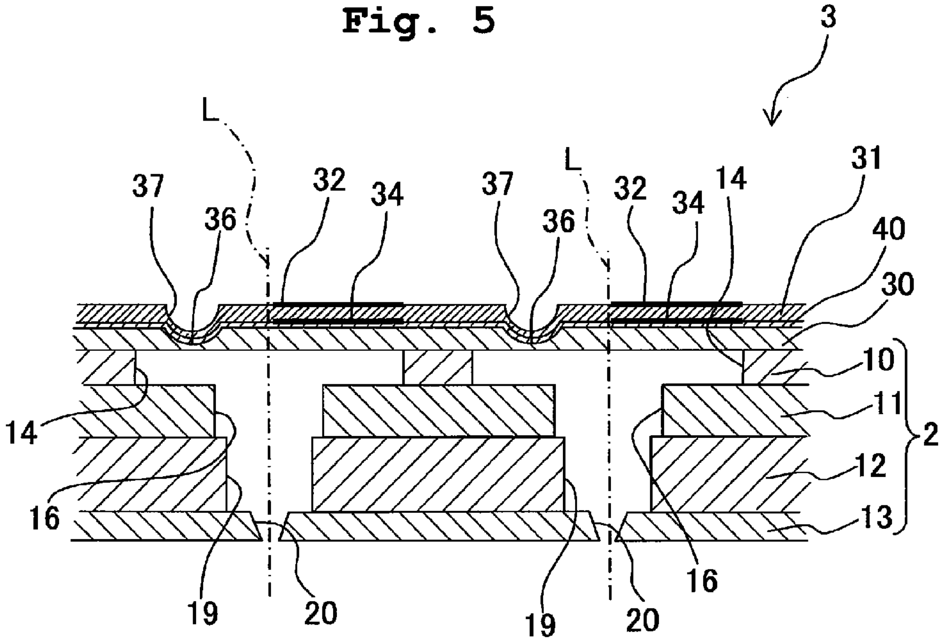
FIG. 5 shows a sectional view taken along a line V-V shown in FIG. 3.

FIG. 5 shows a sectional view illustrating the piezoelectric actuator 3. The width in the transverse direction of the pressure chamber 14 shown in FIG. 5 may be about 250 to 300 μm. The dividing line L, which passes through the center in the transverse direction, is arranged at the position corresponding to the dividing line C shown in FIG. 3 as viewed in a plan view of the vibration plate 30. As shown in FIG. 5, the recess 36, which extends in the longitudinal direction of the pressure chamber 14 and which has, for example, a semicircular cross-sectional shape, is formed on the upper surface of the vibration plate 30 at the area on the left side of the dividing line L. The recess 36 may be formed to arrive at a depth of about 10 μm from the upper surface of the vibration plate 30. The insulating film 40 is formed on the upper surface of the vibration plate 30. The common electrode 34 is formed, on the upper surface of the insulating film 40, at the area overlapped with the pressure chamber 14 and disposed on the right side with the dividing line L intervening therebetween from the area in which the recess 36 of the vibration plate 30 is formed as viewed in a plan view.

On the upper surface of the vibration plate 30, the common electrode 34 may have such a size that the common electrode 34 extends to an area which exceeds the dividing line L in the transverse direction of the pressure chamber 14 (an area which is disposed on the left side of the dividing line L in FIG. 5), provided that the recess 36 is not formed in the area. The common electrodes 34 are connected to one another (not shown), which are retained at the same electric potential or the ground electric potential. When the common electrodes 34 are connected to one another, for example, lead wires may be connected to the respective common electrodes 34 so that no interference occurs with respect to the recesses 36. The common electrode 34 may be formed in an area disposed on the right side from the dividing line L (not shown) and separated from the dividing line L.

The piezoelectric layer 31, which contains a main component of lead zirconium titanate (PZT) as a ferroelectric material and as a solid solution of lead titanate and lead zirconate, is formed on the surfaces of the insulating film 40 and the common electrodes 34. The piezoelectric layer 31 is formed continuously to range over the plurality of pressure chambers 14. However, recesses 37, which have the same planar shapes as those of the recesses 36, are formed at the positions of the piezoelectric layer 31 corresponding to the recesses 36 formed on the vibration plate 30. As shown in FIGS. 4 and 5, the thickness of the piezoelectric layer 31 at the recess 37 is thinner than the thickness (about 10 μm) of the piezoelectric layer 31 in the other areas.

The individual electrode 32 is formed at the position corresponding to the common electrode 34 as viewed in a plan view, on the surface of the piezoelectric layer 31. The individual electrode 32 and the common electrode 34 are arranged so that they are coincident with each other as viewed in a plan view of the vibration plate 30. Therefore, the electric field, which is to be generated between the individual electrode 32 and the common electrode 34 as described later on, can be generated between the both electrodes. Accordingly, the electric field can be reliably generated in only the piezoelectric layer 31, positioned between the common electrode 34 and the individual electrode 32, to act as the driving area. Therefore, it is possible to suppress the electric power consumption.

The individual electrode 32 is composed of a conductive material such as gold. Further, terminals 35, which are connected to the individual electrodes 32, are formed respectively at positions not overlapped with the pressure chambers 14 as viewed in a plan view, on the surface of the piezoelectric layer 31. The terminals 35 are electrically connected to a driver IC (not shown) via a flexible wiring member such as a flexible printed circuit board. The driving voltage is selectively supplied from the driver IC via the terminals 35 to the plurality of individual electrodes 32. The individual electrode 32 may be formed to be larger than the common electrode 32 or smaller than the common electrode 32.

Next, the action of the piezoelectric actuator 3 will be explained with reference to FIG. 6.

When the electric potential is selectively applied to the individual electrode 32 by the driver IC, then the difference in electric potential is generated between the individual electrode 32 and the common electrode 34, and the electric field is generated in the thickness direction in the piezoelectric layer 31 interposed therebetween. When the direction of polarization of the piezoelectric layer 31 is the same as the direction of the electric field, the piezoelectric layer 31 is shrunk in the horizontal direction perpendicular to the thickness direction.

Figure 6:
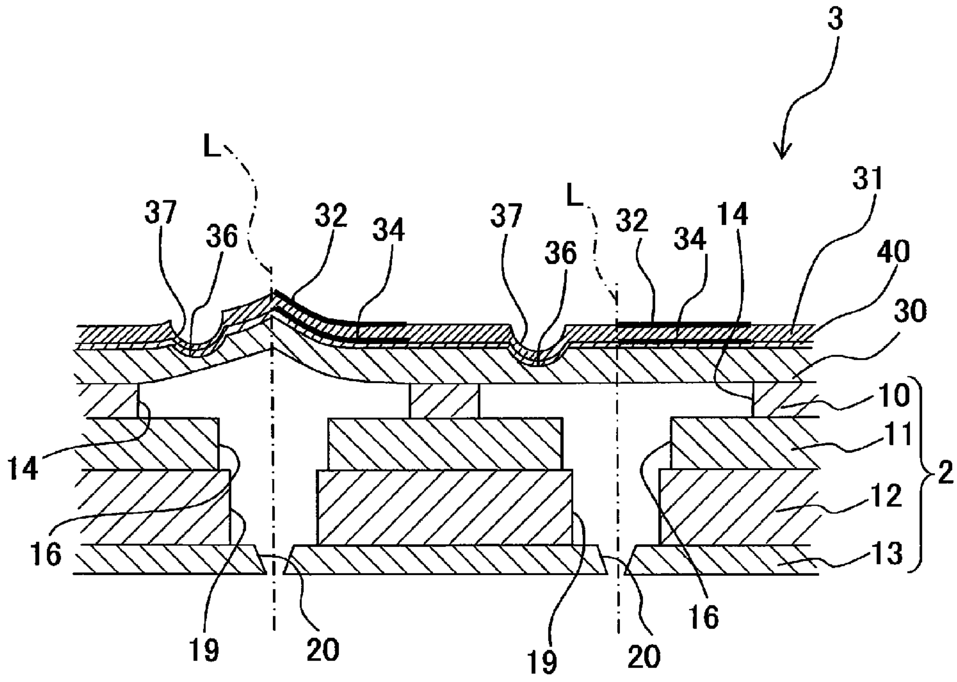
FIG. 6 shows the operation of a piezoelectric actuator shown in FIG. 5.

In this situation, as shown in FIG. 6, the portion of the edge of the pressure chamber 14, which is positioned on the right side of the dividing line L in the area of the vibration plate 30 overlapped with the pressure chamber 14, is fixed to the cavity plate 10, and the deformation is restricted. Therefore, the vibration plate 30 is deformed in accordance with the shrinkage to project toward the side not facing the pressure chamber 14 being the portion of the edge of the pressure chamber 14 positioned on the right side of the dividing line L a support point.

In accordance with this deformation, the portion of the piezoelectric layer 31, which is disposed on the left side from the portion interposed between the individual electrode 32 and the common electrode 34, is pushed and lifted upwardly as well.

In the piezoelectric actuator 3 of this embodiment, the portion of the edge of the pressure chamber 14, which serves as the support point portion for the deformation brought about when the piezoelectric layer 31 is shrunk, extends in the longitudinal direction of the pressure chamber 14. The portion of the edge of the pressure chamber 14 except for the support point portion serves as the portion to restrict the deformation of the vibration plate 30, which corresponds to the portion of the edge positioned in the transverse direction of the pressure chamber 14 in the piezoelectric actuator 3 of this embodiment.

The recesses 36, 37 and the driving area composed of the individual electrode 32 and the common electrode 34 are aligned in the transverse direction of the pressure chamber 14 so that the support point portion of the deformation of the piezoelectric layer 31 is positioned in the longitudinal direction of the pressure chamber 14 as in this embodiment. Accordingly, the area of the portion, which inhibits the deformation of the vibration plate 30 caused by the deformation of the piezoelectric layer 31, is decreased. Accordingly, it is possible to improve the deformation efficiency of the vibration plate 30.

The recess 36 is formed at the portion disposed on the left side as described above, on the vibration plate 30. Therefore, the thickness thereof is thinned, and the rigidity of such a portion is decreased. Further, the recess 37 is formed on the piezoelectric layer 31 corresponding to the portion of the vibration plate 30 at which the recess 36 is formed. The thickness of the recess 37 is thinner than the thickness of the piezoelectric layer 31 stacked on the portion at which the recess 36 is not formed.

Therefore, the rigidity can be made extremely small for the portion at which the recess 36 of the vibration plate 30 and the recess 37 of the piezoelectric layer 31 corresponding thereto are formed, as compared with a case in which the recess 36 is not formed for the vibration plate 30 or a case in which the thickness of the piezoelectric layer 31 stacked on the vibration plate 30 is uniform.

Further, it is possible to decrease the rigidities of the deformation portions of the vibration plate 30 and the piezoelectric layer 31 provided to deform the pressure chamber 14 to project upwardly.

Subsequently, the portion, at which the recess 36 of the vibration plate 30 is formed, is greatly pushed and lifted upwardly in accordance with the deformation of the piezoelectric layer 31.

Accordingly, the volume of the pressure chamber 14 is increased, and the pressure of the ink in the pressure chamber 14 is decreased. Therefore, the ink inflows from the manifold 17 into the pressure chamber 14.

When the electric potential of the individual electrode 32 is returned to the ground electric potential at the timing at which the negative pressure wave, which is generated in the pressure chamber 14 when the vibration plate 30 is deformed, is reversed to the positive, then the deformation of the vibration plate 30 is returned to the original state, and the volume of the pressure chamber 14 is returned to the original state as well. In this situation, the pressure wave, which is generated when the vibration plate 30 is deformed, is superimposed with the pressure wave which is generated when the deformation of the vibration plate 30 is returned to the original state, and the pressure in the pressure chamber 14 is increased. Therefore, the ink is discharged to the recording paper P from the nozzle 20 communicated with the pressure chamber 14.

In the ink-jet head 1 of this embodiment, the recess 36 is formed in one area of the two areas of the vibration plate 30 which are overlapping with the pressure chamber 14 and which are divided by the dividing line C passing through the center of the pressure chamber 14 as viewed in a plan view of the vibration plate 30. Therefore, it is possible to secure the large area in which the recess 36 can be formed in the area overlapping with each of the pressure chambers 14. It is possible to decrease the rigidity of the vibration plate 30 at the portion as described above. Further, as described later on, the recess 37 of the piezoelectric layer 31 stacked on the recess 36, which is included in the piezoelectric layer 31 stacked on the vibration plate 30, has the thickness which can be made thinner than the thickness of the piezoelectric layer 31 at the other portions as well.

The thickness of the recess 37 of the piezoelectric layer 31 stacked on the recess 36 of the vibration plate 30 can be made thinner than the thickness of the piezoelectric layer 31 at the other portions. Therefore, it is also possible to further decrease the rigidity as compared with a case in which a piezoelectric layer 31 having a uniform thickness is formed without providing any space.

Next, a method for producing the ink-jet head 1 will be explained with reference to FIG. 7.

Figure 7A:
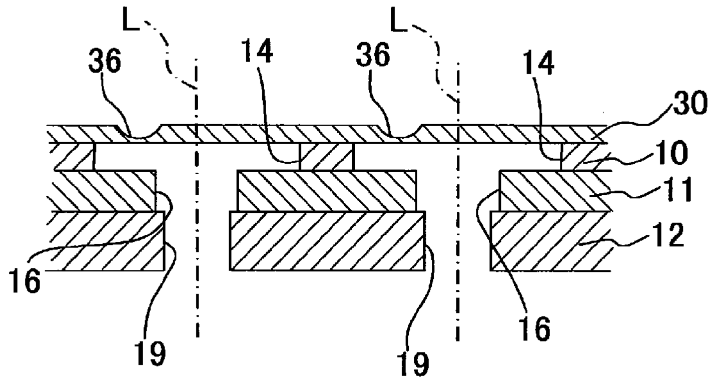
FIG. 7A shows a recess-forming step and a joining step.

At first, as shown in FIG. 7A, the three metal plates, i.e., the cavity plate 10, the base plate 11, and the manifold plate 12 other than the nozzle plate 13 made of the synthetic resin, which are included in the plates 10 to 13 for constructing the flow passage unit 2, are joined to one another. On the other hand, the recesses 36, which extend in the longitudinal direction of the pressure chambers 14, are formed, on the upper surface of the vibration plate 30 (surface disposed on the side opposite to the surface to be joined to the flow passage unit 2), in the areas which are overlapping with the pressure chambers 14 and which are positioned on the left side of the dividing line L passing through the centers of the pressure chambers 14. In this embodiment, the vibration plate 30 is composed of the metal material such as stainless steel. Therefore, the recesses 36 can be easily formed, for example, by means of the etching or the press working.

The vibration plate 30, on which the recesses 36 are formed, is joined to the upper surface of the cavity plate 10 to cover the plurality of pressure chambers 14 therewith by means of the diffusion bonding or diffusion joining or the adhesive.

Figure 7B:
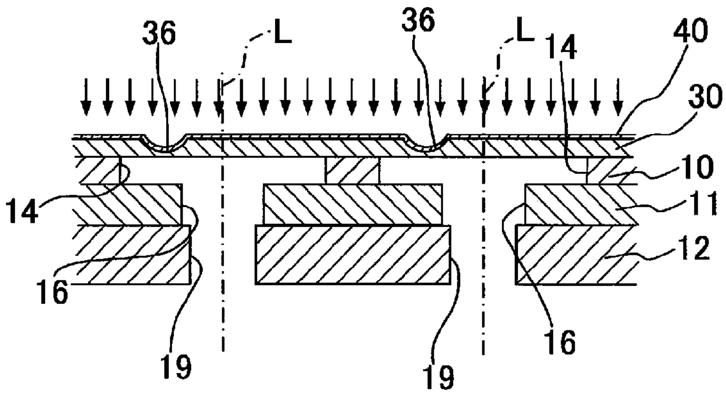
FIG. 7B shows an insulating film-forming step.

Subsequently, as shown in FIG. 7B, the insulating film 40 is formed on the surface of the vibration plate 30 on the side opposite to the flow passage unit 2. When the insulating film is formed, for example, the ceramics material such as alumina or zirconia is deposited on the surface of the vibration plate 30, for example, by means of the chemical vapor deposition (CVD) method, the aerosol deposition method (AD method), or the sputtering method to form the insulating film 40 thereby. In this procedure, parts of the insulating film 40, which are included in the insulating film 40 stacked on the surface of the vibration plate 30 and which are stack in the areas formed with the recesses 36, are recessed. Accordingly, the recesses 37, which have the same planar shapes as those of the recesses 36 of the vibration plate 30, are formed on the insulating film 40.

Figure 7C:
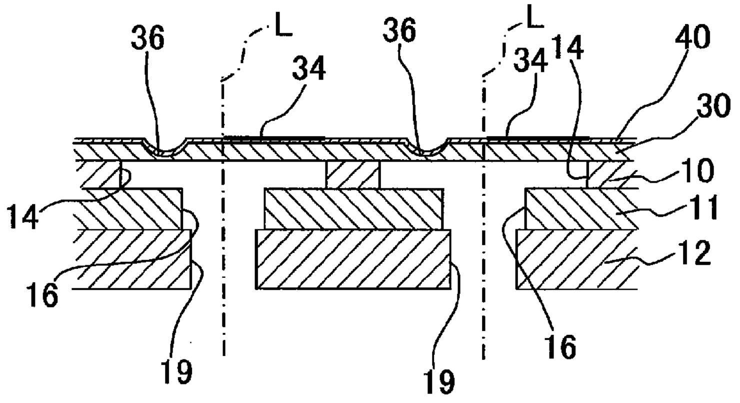
FIG. 7C shows a common electrode-forming step.

Subsequently, as shown in FIG. 7C, the plurality of common electrodes 34 are formed by using, for example, the screen printing method, the vapor deposition method, or the sputtering method, on the surface of the vibration plate 30 disposed on the side opposite to the flow passage unit 2, in the areas which are overlapping with the plurality of pressure chambers 14 respectively and which are not formed with the recesses 36 on the right side from the dividing line L. When the common electrodes are formed, the common electrodes 34 may be formed to extend to areas disposed on the left side from the dividing line L shown in FIG. 7C, provided that the areas are not overlapping with the recesses 36 of the vibration plate 30.

Figure 7D:
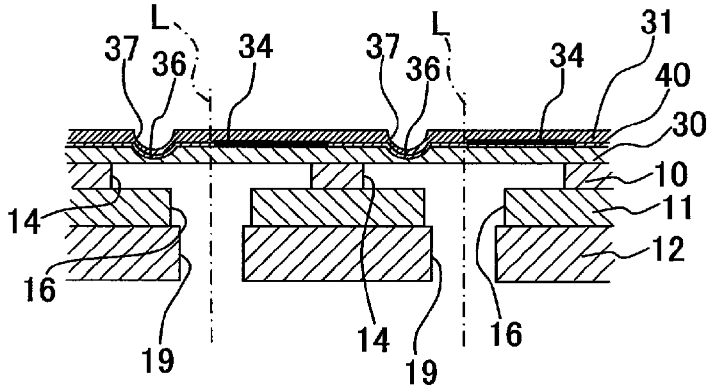
FIG. 7D shows a piezoelectric layer-forming step.

Subsequently, as shown in FIG. 7D, the piezoelectric layer 31 is formed on the upper surfaces of the common electrodes 34 and the insulating film 40 formed on the surface of the vibration plate 30 disposed on the side opposite to the flow passage unit 2. In this procedure, when the piezoelectric layer is formed, particles of the piezoelectric material are deposited on the surfaces of the insulating film 40 and the common electrodes 34, for example, by means of the CVD method or the AD method to form the piezoelectric layer 31 thereby. In this procedure, the piezoelectric layer 31 is deposited in the recessed form, and the recesses 37, which have the same planar shapes as those of the recesses 36 of the vibration plate 30, are also formed on the piezoelectric layer 31 in the areas of the vibration plate 30 in which the recesses 36 are formed as well, in the same manner as the insulating film 40 described above.

Figure 8:
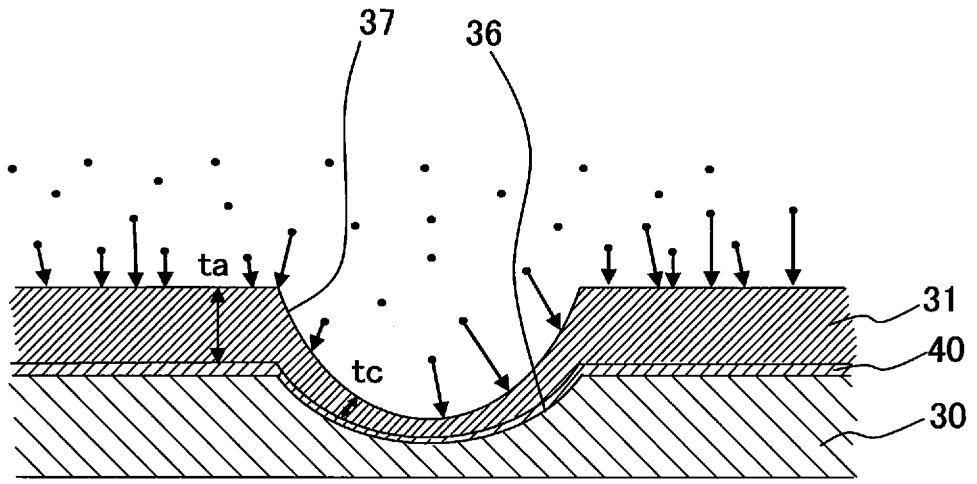
FIG. 8 illustrates the piezoelectric layer-forming step based on the CVD method.

An explanation will now be made, for example, about a procedure in which the metalorganic chemical vapor deposition (MOCVD) method is used to form the thin film by dissolving a raw material in an organic solvent to effect the vaporization so that the vapor phase reaction is caused on a treatment objective surface, as an example of the formation of the piezoelectric layer 31 by using the CVD method. Those usable as the raw material include, for example, lead bis (dipivaloylmethanate) ($Pb(DPM)_2$), zirconium tetrakis (dipivaloylmethanate) ($Zr(DPM)_4$), and titanium (diisopropoxy-dipivaloylmethanate) ($Ti(iPrO)_2(DPM)_2$) (see, for example, Japanese Patent Application Laid-open No. 2004-79695). When the vibration plate 30 is heated to about 600° C., then the vapor phase reaction is caused between the raw materials as described above on the surface of the vibration plate 30, and the piezoelectric layer 31 is formed on the surface of the vibration plate 30. In this procedure, as shown in FIG. 8, the raw material gas is hardly supplied to the internal space of the recess 36 formed on the vibration plate 30 as compared with the surface of the vibration plate 30 formed with no recess 36. Therefore, the velocity of formation of the piezoelectric layer 31 is slow on the surface of the recess 36. Therefore, the thickness tc of the piezoelectric layer 31 at the recess 37 is thinner than the thickness ta of the piezoelectric layer 31 in the other areas.

However, if the opening of the recess 36 formed on the surface of the vibration plate 30 is large, the raw material gas is consequently supplied to the internal space of the recess 36 for introducing the raw material gas thereinto from the outside in the same manner as the surface of the vibration plate 30 formed with no recess 36. Accordingly, the velocity of formation of the piezoelectric layer 31 in the internal space of the recess 36 is equal to that of the surface of the vibration plate 30 formed with no recess 36. The thickness of the piezoelectric layer 31 at the recess 37 is equal to the thickness of the piezoelectric layer 31 in the other areas.

Figure 9:
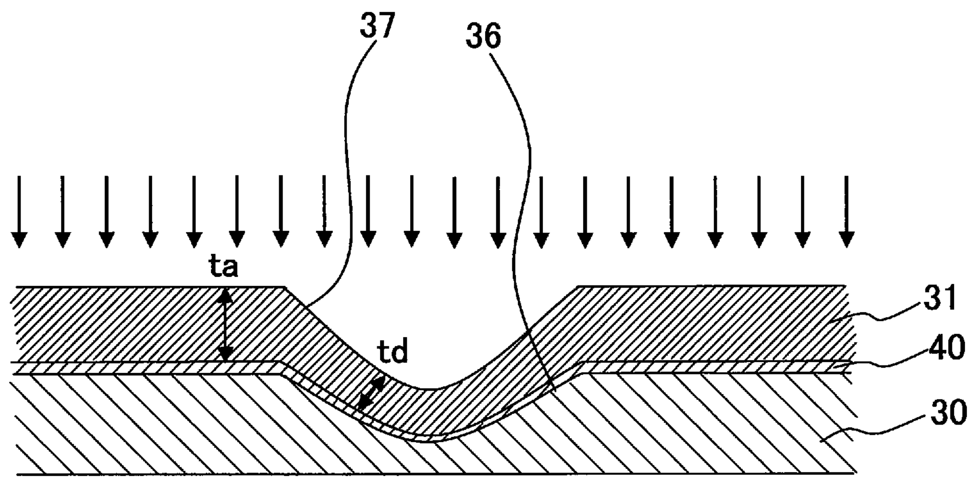
FIG. 9 illustrates the piezoelectric layer-forming step based on the AD method.

On the other hand, when the piezoelectric layer 31 is formed by using the AD method in which an ultrafine particle material is allowed to collide with the treatment objective surface at a high velocity together with the carrier gas as shown in FIG. 9, the upward blow of the fine particles is caused from the inside to the outside in the recess 36 when the fine particles are jetted, if any recess such as the recess 36 having the inner surface is formed. Accordingly, the jetting velocity of the jetted fine particles is decreased or weakened, and the fine particles, which do not contribute to the film formation, are rebounded at a large ratio on the inner surface of the recess 36. Therefore, the fine particles are hardly deposited on the inner surface of the recess 36.

As described above, the particles of the piezoelectric material are hardly deposited on the inner surface of the recess 36 as compared with the other surface of the vibration plate 30.

Therefore, as shown in FIG. 9, the thickness td of the recess 37 of the piezoelectric layer 31 formed in the recess 36 is thinner than the thickness ta of the piezoelectric layer 31 in the other areas.

On the other hand, if the opening of the recess 36 formed on the surface of the vibration plate 30 is large as viewed in a plan view of the vibration plate 30, the upward blow of the fine particles from the inside to the outside of the recess 36, which is generated when the fine particles are jetted, is decreased or weakened. Therefore, the fine particles, which do not contribute to the film formation, are rebounded at a small ratio on the inner surface of the recess 36. The fine particles of the piezoelectric material are deposited on the inner surface of the recess 36 as compared with the case in which the opening of the recess 36 is small. Therefore, the thickness of the recess 37 of the piezoelectric layer 31 formed at the position corresponding to the recess 36 on the surface of the vibration plate 30 is equal to the thickness of the piezoelectric layer 31 formed in the areas in which the recess 36 is not formed.

As described above, when the opening of the recess 36 formed on the vibration plate 30 is small, the piezoelectric material is hardly deposited in the recess 36 when the piezoelectric material is deposited by using the CVD method or the AD method. Therefore, the piezoelectric layer 31, which is formed on the surface of the recess 36, can be formed to be thinner than the piezoelectric layer 31 which is formed in the other areas. Accordingly, the thickness of the recess 37 of the piezoelectric layer 31 formed corresponding to the recess 36 having the small opening can be made thin as compared with the case in which the opening of the recess 36 is large. It is possible to degrease the rigidities of the vibration plate 30 and the piezoelectric layer 31. The cross-sectional shape of the recess 36 is not limited to the semicircular shape as shown in FIGS. 8 and 9, which may be, for example, V-shaped or U-shapes forms, provided that the thickness of the piezoelectric layer 31 formed on the surface of the recess 36 can be made thinner than the thickness of the piezoelectric layer 31 formed in the other areas.

Figure 7E:
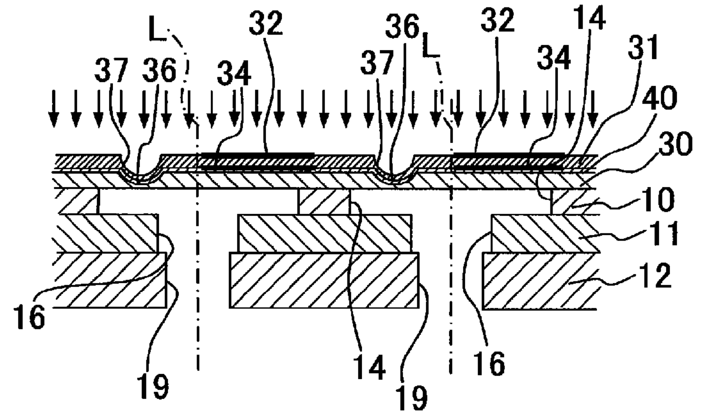
FIG. 7E shows an individual electrode-forming step.
Figure 7F:
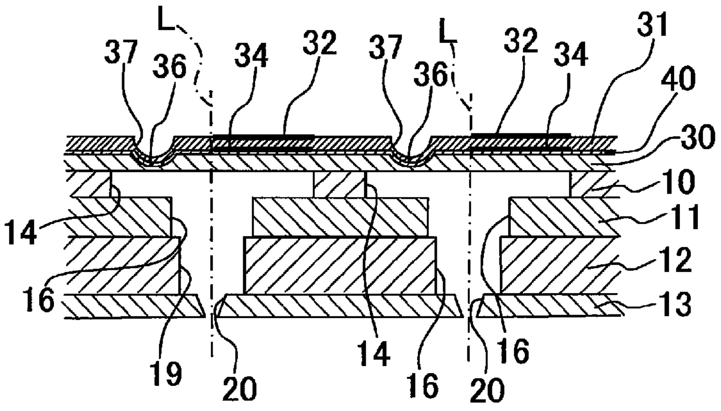
FIG. 7F shows a step for joining a nozzle plate 13 to a lower surface of a manifold plate 12.

After the piezoelectric layer 31 is formed on the surface of the vibration plate 30, the annealing treatment is performed in order that the sufficient piezoelectric characteristic is secured for the piezoelectric layer 31. Subsequently, as shown in FIG. 7E, the plurality of individual electrodes 32 are formed in the areas of the surface of the piezoelectric layer 31 overlapping with the plurality of common electrodes 34 respectively as viewed in a plan view of the vibration plate 30 by using, for example, the screen printing method, the vapor deposition method, or the sputtering method. Finally, as shown in FIG. 7F, the nozzle plate 13 made of the synthetic resin is joined to the lower surface of the manifold plate 12 to complete the production of the ink-jet head 1.

Alternatively, in the steps of producing the ink-jet head 1 described above, the vibration plate 30, on which the recesses 36 are formed, may be joined to the cavity plate 10 which constitutes a part of the flow passage unit 2, and then the other metal plates (base plate 11 and manifold plate 12), which constitute the flow passage unit 2, may be joined to the cavity plate 10. When the nozzle plate 13 is a metal plate composed of, for example, stainless steel, the nozzle plate 13 may be joined to the other three metal plates (cavity plate 10, base plate 11, and manifold plate 12) to previously form the flow passage unit 2 before the vibration plate 30 is joined to the cavity plate 10. Further alternatively, the flow passage unit 2 (or the cavity plate 10 of the flow passage unit 2) may be joined to the vibration plate 30, and then the recesses 36 may be formed on the surface of the vibration plate 30. Further alternatively, all of the recesses 36, the insulating film 40, the common electrodes 34, the piezoelectric layer 31, and the individual electrodes 32 may be formed on the vibration plate 30, and the flow passage unit 2 (or the cavity plate 10 of the flow passage unit 2) may be joined to the vibration plate 30. In this case, it is desirable that the components are joined to one another by means of the adhesive other than the diffusion bonding.

According to the method for producing the ink-jet head 1 explained above, the following effect is obtained.

When the recess is formed, the recess 36, which extends in the longitudinal direction of the pressure chamber 14, is formed in one area of the areas which are overlapping with each of the pressure chambers 14 as viewed in a plan view of the vibration plate 30 and which are divided by the dividing line L passing through the center of the pressure chamber 14, on the surface of the vibration plate 30 disposed on the side not facing the flow passage unit 2. Subsequently, the insulating film 40 is stacked on the surface of the vibration plate 30 disposed on the side opposite to the flow passage unit 2. Subsequently, when the common electrode is formed, the common electrode 34 is formed in the area which is disposed on the surface of the insulating film 40 on the side opposite to the vibration plate, which is overlapping with the pressure chamber 14, and which is not formed with the recess 36. Subsequently, when the piezoelectric layer is formed, the piezoelectric layer 31 is formed by depositing the particles of the piezoelectric material on the surface of the vibration plate 30. The individual electrode 32 is formed at the position corresponding to the common electrode 34 on the surface of the piezoelectric layer 31.

Therefore, when the recess is formed as described above, the recess 36 can be formed in any one of the areas of the vibration plate 30, the area being overlapping with each of the pressure chambers 14 and the area being disposed in the transverse direction from the dividing line L of the pressure chamber 14. Therefore, it is possible to widen the area in which the recess 36 is formed. Further, it is possible to decrease the rigidity of the vibration plate 30, because the recess 36 can be formed in the wide area on the vibration plate 30.

When the piezoelectric layer is formed, the thickness of the piezoelectric layer 31 deposited at the position of the recess 36 formed on the vibration plate 30 is smaller than the thickness of the piezoelectric layer 31 formed in the area of the vibration plate in which the recess 36 is not formed. Therefore, the thicknesses of the vibration plate 30 and the piezoelectric layer 31 can be made partially thin. It is possible to further decrease the rigidities of the vibration plate 30 and the piezoelectric layer 31 at such portions. Therefore, the rigidity of the vibration plate 30 is decreased by the recess 36 in the area of the vibration plate 30 in which the recess 36 is formed. Further, the thickness of the recess 37 corresponding to the recess 36 can be also decreased for the piezoelectric layer 31 stacked on the vibration plate 30. Therefore, it is possible to decrease the rigidities of such portions. The vibration plate 30 is deformed with ease.

Thus, when the electric potential difference is generated between the individual electrode 32 and the common electrode 34, it is possible to further increase the volume of the pressure chamber 14 which is to be increased by the deformation of the vibration plate 30.

When the piezoelectric layer is formed, the thickness of the piezoelectric layer 37 corresponding to the recess 36, of the piezoelectric layer 31 formed on the upper surface of the vibration plate 30, is made thinner than the thickness of the piezoelectric layer 31 formed in the other areas. Therefore, the thicknesses of the vibration plate 30 and the piezoelectric layer 31 are further thinned at the portion at which the recess 36 is formed. It is possible to decrease the rigidities of the vibration plate 30 and the piezoelectric layer 31.

Additionally, both of the thicknesses of the vibration plate 30 at the portion formed with the recess 36 and the piezoelectric layer 31 stacked on the concerning portion are thin. Therefore, the rigidity is extremely decreased at such portions as compared with the other portions.

Next, an explanation will be made about modified embodiments in which various modifications are applied to the embodiment described above. However, those constructed in the same manner as in the embodiment described above are designated by the same reference numerals, any explanation of which will be appropriately omitted.

Figure 10:
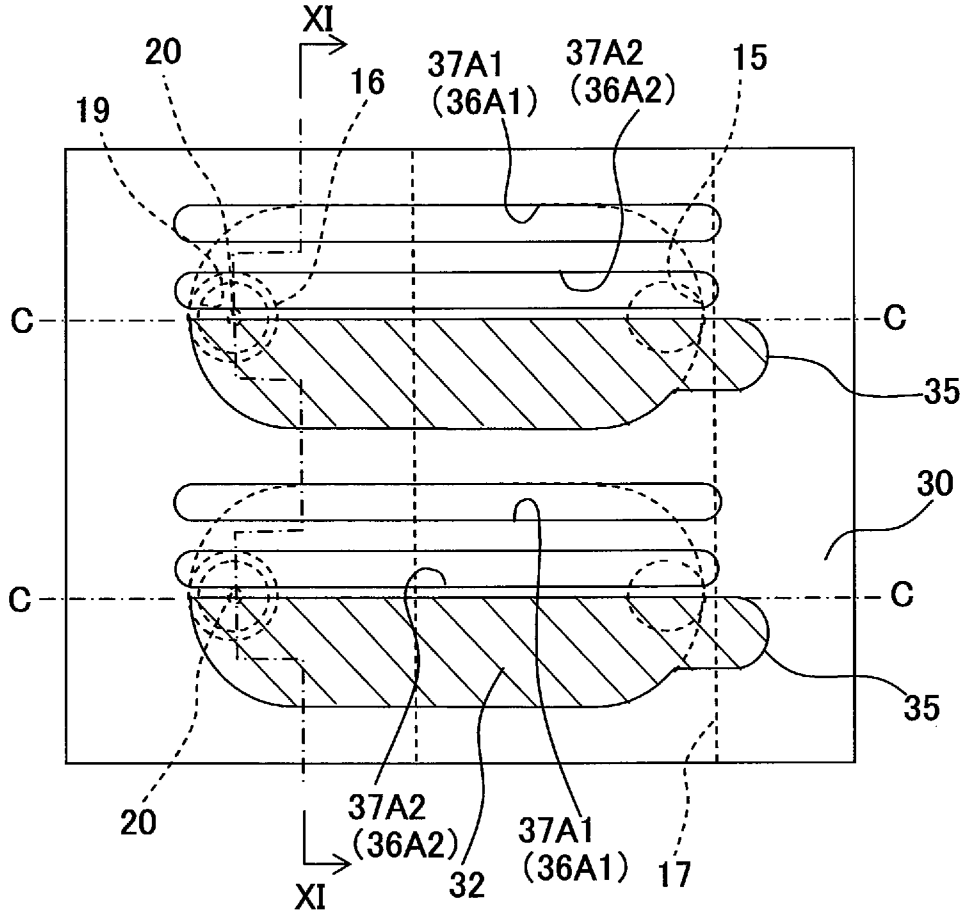
FIG. 10 shows a magnified plan view illustrating a first modified embodiment corresponding to FIG. 3.
Figure 11:
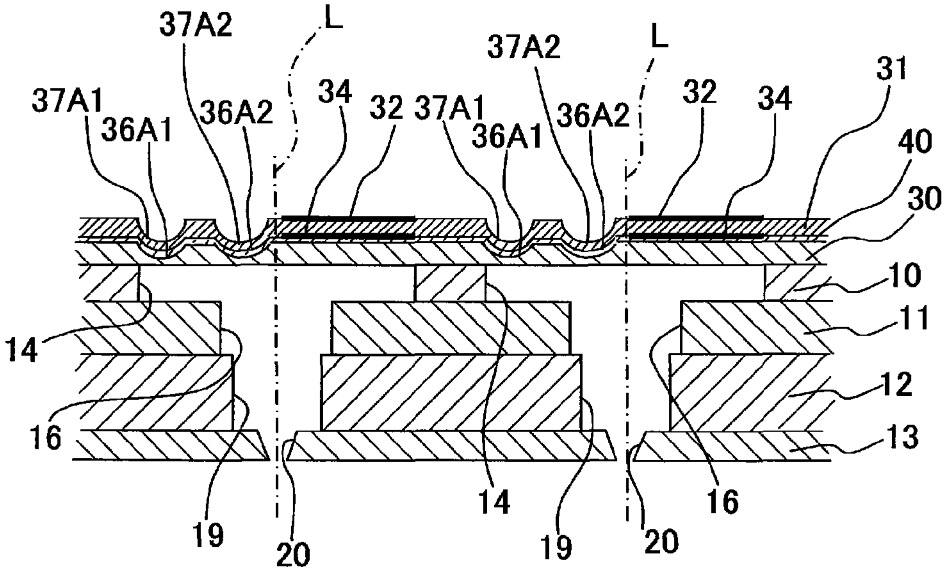
FIG. 11 shows a sectional view taken along a line XI-XI shown in FIG. 10.

The recess 36 formed on the vibration plate 30 is not limited to the shape as illustrated in the embodiment described above. For example, as shown in FIGS. 10 and 11, a plurality of recesses 36A1, 36A2 may be formed so that they are aligned in the transverse direction of the pressure chamber 14 in one area of the areas which are overlapping with the pressure chamber 14 and which are defined by the dividing line passing through the center of the pressure chamber 14 (first modified embodiment). In this embodiment, the two recesses 36 are formed in the area of the vibration plate 30 overlapping with each of the pressure chambers 14. Therefore, it is possible to decrease the rigidity of the vibration plate 30 as compared with the arrangement in which one recess 36 is formed for each.

The thicknesses of a recess 37A1 and a recess 37A2 of the piezoelectric layer 31 formed corresponding to the recess 36A1 and the recess 36A2 of the vibration plate 30 can be made thin. Therefore, it is possible to increase the area of the piezoelectric layer 31 in which the thickness is thin. It is possible to further decrease the rigidities of the vibration plate 30 and the piezoelectric layer 31.

In the first modified embodiment, the two recesses 36 are formed in the area overlapping with each of the pressure chambers 14. However, two or more recesses 36 may be formed so that they are aligned in the transverse direction in the area overlapping with each of the pressure chambers 14. In this arrangement, the plurality of recesses 36A are formed in the area overlapping with each of the pressure chambers 14. Therefore, the width of each of the recesses 36 is decreased in the transverse direction of the pressure chamber 14. Accordingly, it is possible to further thin the thickness of the recesses 37 of the piezoelectric layer 31 formed by the deposition on the recesses 36A. It is also possible to further decrease the rigidity of the vibration plate 30.

Figure 12:
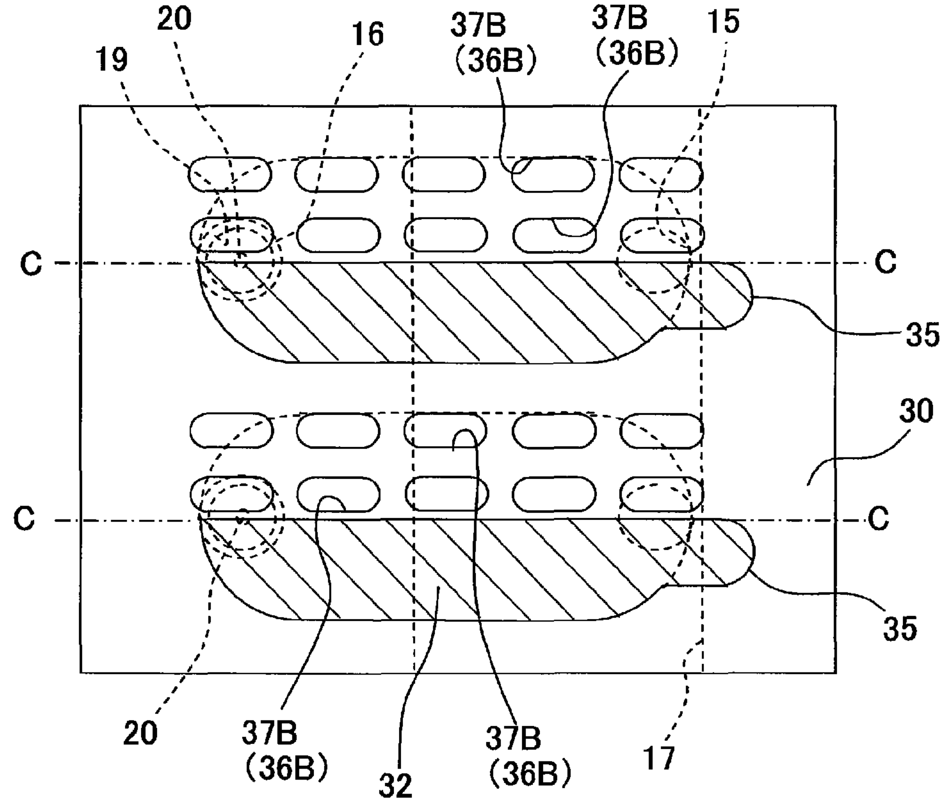
FIG. 12 shows a magnified plan view illustrating a second modified embodiment corresponding to FIG. 3.

As shown in FIG. 12, five recesses 36B may be formed and aligned in the longitudinal direction of the pressure chamber 14. Further, two arrays of the recesses 36B, in each of which the five recesses 36B are aligned, may be formed and aligned in the transverse direction of the pressure chamber 14 (second modified embodiment). In the second modified embodiment, the five recesses 36B are arranged in the longitudinal direction of the pressure chamber 14. Therefore, the openings of the respective recesses 36B are decreased as compared with the case in which the recess 36 is formed to extend in the longitudinal direction of the pressure chamber 14 as shown in FIG. 10. Accordingly, when the piezoelectric layer 31 is formed by using the AD method and/or the CVD method as described above, it is possible to decrease the piezoelectric layer 31 deposited on the recesses 36 as the openings of the recesses 36 are decreased. Simultaneously, it is possible to thin the thickness of the piezoelectric layer 31. Therefore, the thicknesses of the respective recesses 37B of the piezoelectric layer 31 formed on the respective recesses 36B can be made thinner. It is possible to further decrease the rigidity of the vibration plate 30. When the piezoelectric layer 31 is deposited on the recesses 36B having the small openings, the breakage and the crack of the piezoelectric layer 31 are hardly allowed to appear as compared with the case in which the piezoelectric layer 31 is deposited on the recess 36B having the large opening. Therefore, it is possible to enhance the durability.

Figure 13:
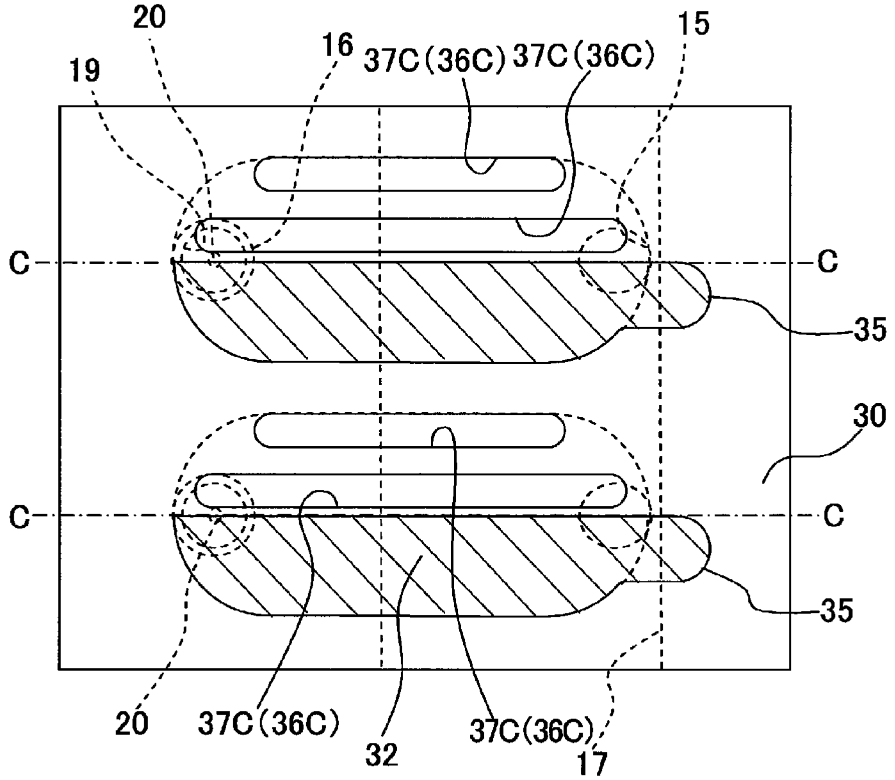
FIG. 13 shows a magnified plan view illustrating a third modified embodiment corresponding to FIG. 3.

As shown in FIG. 13, recesses 36C may be formed in the area overlapping with the pressure chamber 14 as viewed in a plan view of the vibration plate 30 (third modified embodiment). In this embodiment, the recesses 36C are formed in the area overlapping with the pressure chamber 14. Therefore, the recesses 36C do not make any interference with the adjacent pressure chamber 14 even when the adjoining pressure chambers 14 are disposed closely to one another, as compared with the case in which the recess 36 is formed to extend to the outside from the area overlapping with the pressure chamber 14. Therefore, the pressure chambers 14 can be arranged at a high density.

Figure 14:
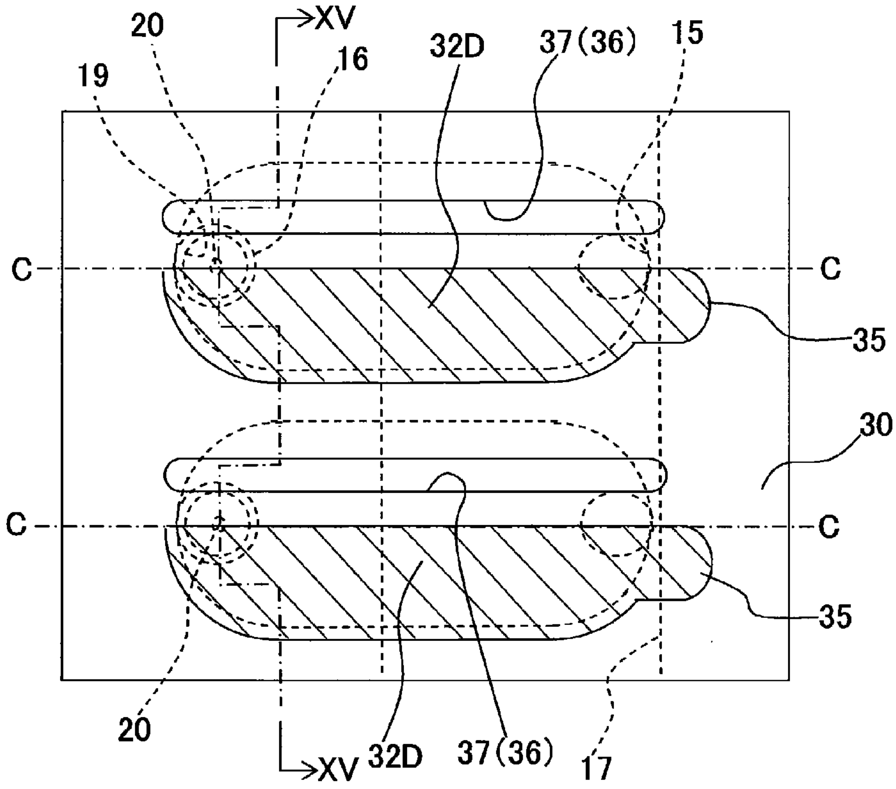
FIG. 14 shows a magnified plan view illustrating a fourth modified embodiment corresponding to FIG. 3.
Figure 15:
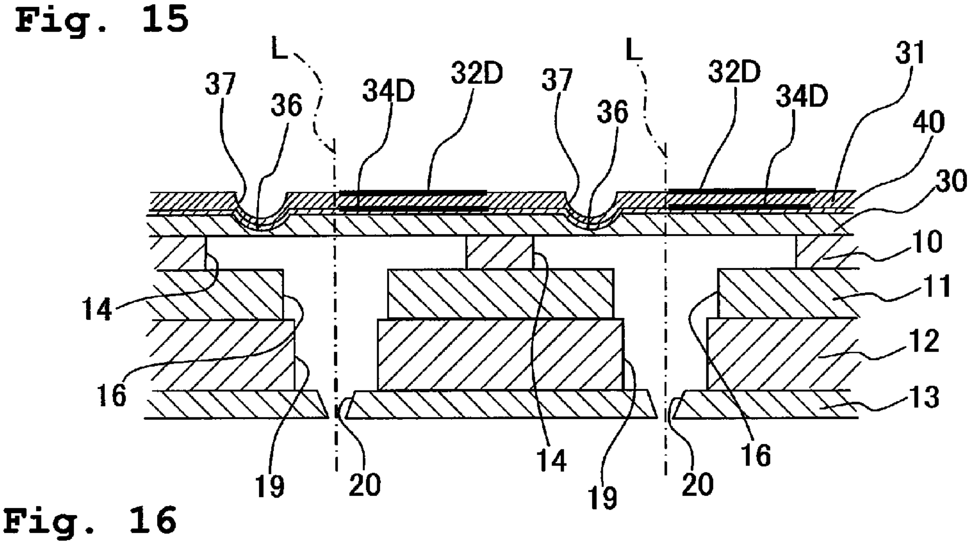
FIG. 15 shows a sectional view taken along a line XV-XV shown in FIG. 14.

As shown in FIGS. 14 and 15, a common electrode 34D and an individual electrode 32D may be formed to extend to the outside of the area of the vibration plate 30 overlapping with the pressure chamber 14 as viewed in a plan view (fourth modified embodiment). In this embodiment, as shown in FIG. 15, a portion of the piezoelectric layer 31, which is positioned in the area disposed outside the pressure chamber 14, is also shrunk in the direction parallel to the surface thereof, in relation to the piezoelectric layer 31 interposed between the common electrode 34D and the individual electrode 32D.

Therefore, the deformation of the vibration plate 30 is increased at the portion corresponding to the edge portion at the inside of the pressure chamber 14 as compared with the case in which the common electrode 34 and the individual electrode 32 are formed in the area overlapping with the pressure chamber as shown in FIG. 3. Accordingly, the amount of deformation of the vibration plate 30 is also increased in the area in which the recess is formed.

Accordingly, the vibration plate 30 can be deformed more greatly by using the same driving voltage. Therefore, it is possible to further suppress the electric power consumption.

The vibration plate 30 is not limited to those having the conductivity composed of the metal material or the like. For example, it is also possible to adopt those composed of non-conductive materials such as silicon, synthetic resin, glass, and ceramics materials to which the surface oxidization treatment is applied (fifth modified embodiment).

Figure 16:
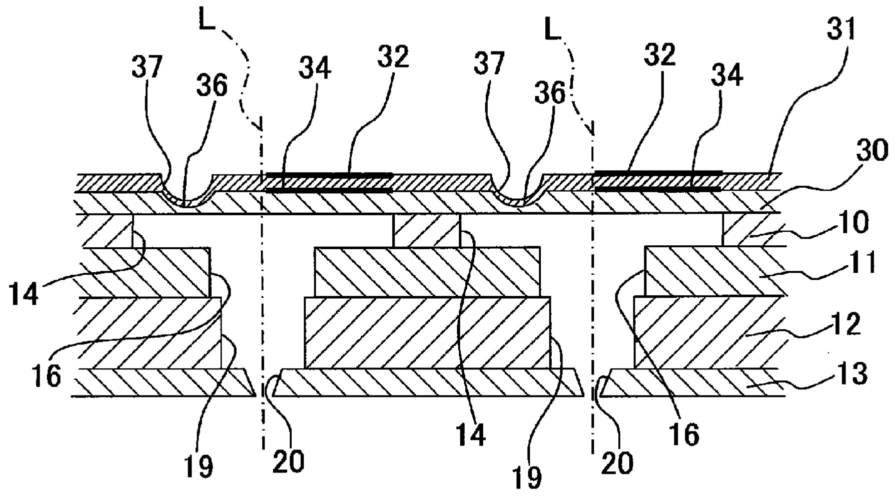
FIG. 16 shows a sectional view illustrating a fifth modified embodiment corresponding to FIG. 5.

The vibration plate 30 of the fifth modified embodiment is composed of the non-conductive material. Therefore, as shown in FIG. 16, it is unnecessary to interpose the insulating film 40 between the vibration plate 30 and the common electrode 34. It is possible to simplify the production steps. That is, the recesses 36 may be formed on the non-conductive vibration plate 30, for example, by means of the etching, the press working, or the injection molding, and the vibration plate 30 may be joined to the surface of the cavity plate 10. After that, the plurality of common electrodes 34 may be formed in the areas of the surface of the vibration plate 30 overlapping with the plurality of pressure chambers 14 respectively by using, for example, the screen printing method, the vapor deposition method, or the sputtering method.

The rigidity of the vibration plate 30 can be further decreased, because the insulating film 40 is not stacked, as compared with the case in which the insulating film 40 is stacked on the vibration plate 30. Further, it is possible to simplify the production steps.

Figure 17:
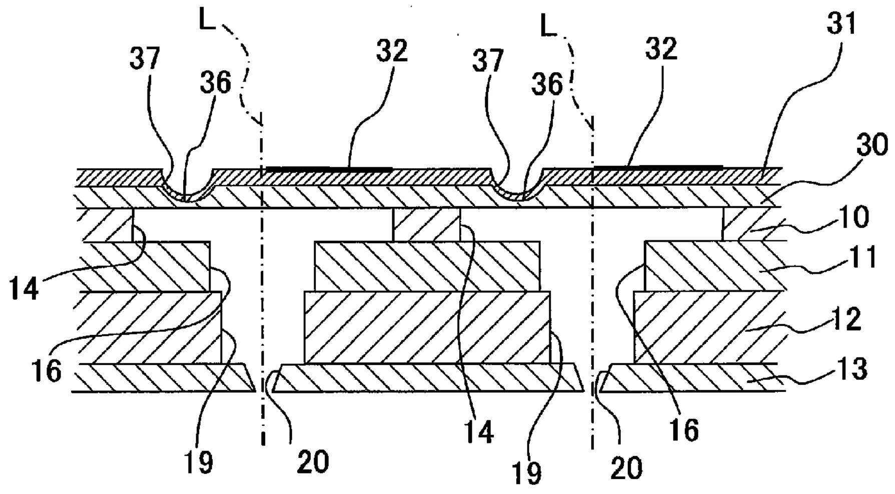
FIG. 17 shows a sectional view illustrating a sixth modified embodiment corresponding to FIG. 5.

Further, a conductive material such as a metal material may be used for the vibration plate 30 so that the vibration plate 30 also serves as the common electrode (sixth modified embodiment). As shown in FIG. 17, in the sixth modified embodiment, the piezoelectric layer 31 is stacked on the surface of the vibration plate 30 disposed on the side opposite to the pressure chamber 14. The individual electrode 32 is formed at the position corresponding to the pressure chamber 14 on the upper surface of the piezoelectric layer 31. The area of the piezoelectric layer 31, which corresponds to the individual electrode 32, is the driving area.

At least the surface of the vibration plate 30, which makes contact with the piezoelectric layer 31, may be conductive.

In the sixth embodiment, the common electrode 34 is not formed as well in addition to the insulating film 40. Therefore, it is possible to further simplify the production steps.

In the piezoelectric actuator 3 of the embodiment described above, the individual electrode 32 may be arranged between the piezoelectric layer 31 and the vibration plate 30 (or the insulating film 40), and the common electrode 34 may be arranged at the position corresponding to the individual electrode 32, on the surface of the piezoelectric layer 31 disposed on the side opposite to the surface which faces the individual electrode 32 (seventh modified embodiment).

In this embodiment, the individual electrodes 32 are positioned on the lower surface of the piezoelectric layer 31. Therefore, it is necessary that the individual electrodes 32 and the wirings of the individual electrodes 32 should be led to the outside of the piezoelectric layer 31. The individual electrodes 32 are connected to one another by lead wires respectively, and the respective lead wires are allowed to extend in the in-plane direction of the vibration plate 30 so that the respective lead wires are not overlapping with the recesses 36, and the lead wires are exposed to the outside of the piezoelectric actuator 3 (not shown).

The embodiment and the modified embodiments thereof described above are examples in which the present invention is applied to the ink-jet head for jetting the ink from the nozzles. However, the liquid transport apparatus, to which the present invention is applicable, is not limited to the ink-jet head. For example, the present invention is applicable to various types of liquid droplet-jetting apparatuses in order that a fine wiring pattern is formed on a substrate by jetting a conductive paste, a high definition display is formed by jetting an organic light-emitting material to a substrate, and a fine optical device such as an optical waveguide is formed by jetting an optical resin to a substrate.

The present invention is also applicable to any liquid droplet-jetting apparatus for jetting any liquid other than the ink including, for example, those for reagents, biological solutions, wiring material solutions, electronic material solutions, refrigerants, and fuel as well as to any liquid transport apparatus having no nozzle for transporting the liquid as described above.

What is claimed is:

1. A method for producing a liquid transport apparatus including: a flow passage unit which includes a pressure chamber having a liquid inflow port and a liquid outflow port; and a piezoelectric actuator which includes a vibration plate joined to one surface of the flow passage unit to cover the pressure chamber therewith and a piezoelectric layer formed of a piezoelectric material and which selectively changes a volume of the pressure chamber, the method comprising:

forming a recess, on a surface of the vibration plate on a side not facing the pressure chamber, wherein an area, of the vibration plate, overlapping the pressure chamber is divided into a first area and a second area by a dividing line, and the recess is formed only in the first area;

forming the piezoelectric layer by depositing particles of the piezoelectric material on the surface of the vibration plate on which the recess is formed so that a thickness of a portion of the piezoelectric layer positioned at the recess is thinner than a thickness of another portion of the piezoelectric layer positioned at an area not formed with the recess; and forming a first electrode, on a surface of the piezoelectric layer on a side not facing the vibration plate, in an area overlapping the second area, wherein the dividing line extends in a predetermined direction to pass through a center of gravity of the pressure chamber.

2. The method for producing the liquid transport apparatus according to claim 1, further comprising forming a second electrode, on the surface of the vibration plate formed with the recess, in the second area, after forming the recess and before forming the piezoelectric layer.

3. The method for producing the liquid transport apparatus according to claim 2, wherein the vibration plate is formed of a metal material, and the method further comprises forming an insulating film on the surface of the vibration plate on which the recess is formed, after forming the recess and before forming the second electrode.

4. The method for producing the liquid transport apparatus according to claim 3, wherein the insulating film is formed by a chemical vapor deposition method or an aerosol deposition method.

5. The method for producing the liquid transport apparatus according to claim 1, wherein the recess is formed as a plurality of recesses only in the first area.

6. The method for producing the liquid transport apparatus according to claim 1, wherein the pressure chamber has an elongate shape, and the recess is formed, on the surface of the vibration plate on the side not facing the pressure chamber, in the first area defined by dividing the area overlapping with the pressure chamber in a transverse direction of the pressure chamber.

7. The method for producing the liquid transport apparatus according to claim 5, wherein the recess is formed to extend in a longitudinal direction of the pressure chamber.

8. The method for producing the liquid transport apparatus according to claim 1, wherein the recess is formed to extend to an area outside of the pressure chamber.

9. The method for producing the liquid transport apparatus according to claim 1, wherein the piezoelectric layer is formed by a chemical vapor deposition method or an aerosol deposition method.

10. A method for producing a liquid droplet-jetting apparatus including: a flow passage unit which has a pressure chamber communicated with a nozzle; and a piezoelectric actuator which has a vibration plate joined to one surface of the flow passage unit to cover the pressure chamber therewith and a piezoelectric layer formed of a piezoelectric material and which selectively changes a volume of the pressure chamber, the method comprising:

forming a recess, on a surface of the vibration plate on a side not facing the pressure chamber, wherein an area, of the vibration plate, overlapping the pressure chamber is divided into a first area and a second area by a dividing line, and the recess is formed in the first area;

forming the piezoelectric layer by depositing particles of the piezoelectric material on the surface of the vibration plate on which the recess is formed so that a thickness of a portion of the piezoelectric layer positioned at the recess is thinner than a thickness of another portion of the piezoelectric layer positioned at an area not formed with the recess; and forming a first electrode, on a surface of the piezoelectric layer on a side not facing the vibration plate, in an area overlapping the second area, wherein the dividing line extends in a predetermined direction to pass through a center of gravity of the pressure chamber.

11. The method for producing the liquid droplet-jetting apparatus according to claim 10, further comprising forming a second electrode, on the surface of the vibration plate formed with the recess, in the second area, after forming the recess and before forming the piezoelectric layer.

* * * * *